US012676620B2

(12) United States Patent
Urakawa

(10) Patent No.: US 12,676,620 B2
(45) Date of Patent: Jul. 7, 2026

(54) CHARGE PUMP CIRCUIT AND PHASE-LOCKED LOOP CIRCUIT

(71) Applicant: Kioxia Corporation, Tokyo (JP)

(72) Inventor: Go Urakawa, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 18/828,011

(22) Filed: Sep. 9, 2024

(65) Prior Publication Data

US 2025/0096805 A1 Mar. 20, 2025

(30) Foreign Application Priority Data

Sep. 14, 2023 (JP) ................................. 2023-149422

(51) Int. Cl.
*H03L 7/089* (2006.01)
*H03L 7/093* (2006.01)
*H03L 7/099* (2006.01)

(52) U.S. Cl.
CPC ............ *H03L 7/0895* (2013.01); *H03L 7/093* (2013.01); *H03L 7/099* (2013.01)

(58) Field of Classification Search
CPC ....... H03L 7/0895; H03L 7/093; H03L 7/099; H03L 7/0896
USPC ....................................................... 327/157
See application file for complete search history.

(56) References Cited

U.S. PATENT DOCUMENTS 6,956,431 B2 * 10/2005 Maejima ............... H03F 3/2173
327/132
9,543,933 B2 * 1/2017 Ito ......................... H02M 3/156

9,680,483 B2 * 6/2017 Tsunoda .................... G05F 3/26
10,135,450 B1 * 11/2018 Urakawa ............... H03L 7/0895
11,218,152 B2 * 1/2022 Ding ....................... H02M 3/07
2007/0132490 A1 * 6/2007 Robinson ............. H03L 7/0893
327/156
2015/0207513 A1 * 7/2015 Tsunoda .................. H02M 3/07
327/66

(Continued)

FOREIGN PATENT DOCUMENTS

JP 2013085077 A 5/2013
JP 2015138327 A 7/2015
JP 2019057751 A 4/2019

OTHER PUBLICATIONS

G. Urakawa et al., "A Noise-Canceling Charge Pump for Area Efficient PLL Design", IEICE Trans, Electron, vol. E104-C, No. 10, Oct. 2021, pp. 625-634 (Year: 2021).*

(Continued)

*Primary Examiner* — Ryan Jager

(74) *Attorney, Agent, or Firm* — Maier & Maier, PLLC

(57) ABSTRACT

According to one embodiment, a charge pump circuit includes: a current source; a first current mirror including an input terminal connected to the current source; a second current mirror including an input terminal connected to an output terminal of the first current mirror; a third current mirror including an input terminal connected to a first output terminal of the second current mirror; a first switch including a first end connected to a second output terminal of the second current mirror via a first node, and including a second end; and an output terminal connected to an output terminal of the third current mirror and the second end of the first switch via a second node.

20 Claims, 6 Drawing Sheets

(56) References Cited

U.S. PATENT DOCUMENTS

| | | | |
|---|---|---|---|
| 2016/0043636 A1* | 2/2016 | Bass | H03L 7/0891 |
| | | | 327/536 |
| 2017/0264193 A1* | 9/2017 | Tsunoda | H03K 5/2481 |
| 2019/0089362 A1* | 3/2019 | Urakawa | H03L 7/0895 |
| 2019/0229614 A1* | 7/2019 | Mikhael | H03F 3/45269 |
| 2025/0096805 A1* | 3/2025 | Urakawa | H03L 7/093 |

OTHER PUBLICATIONS

G. Urakawa et al., "A Noise-Canceling Charge Pump for Area Efficient PLL Design", IEICE Trans, Electron, vol. E104-C, No. 10, Oct. 2021, pp. 625-634.

* cited by examiner

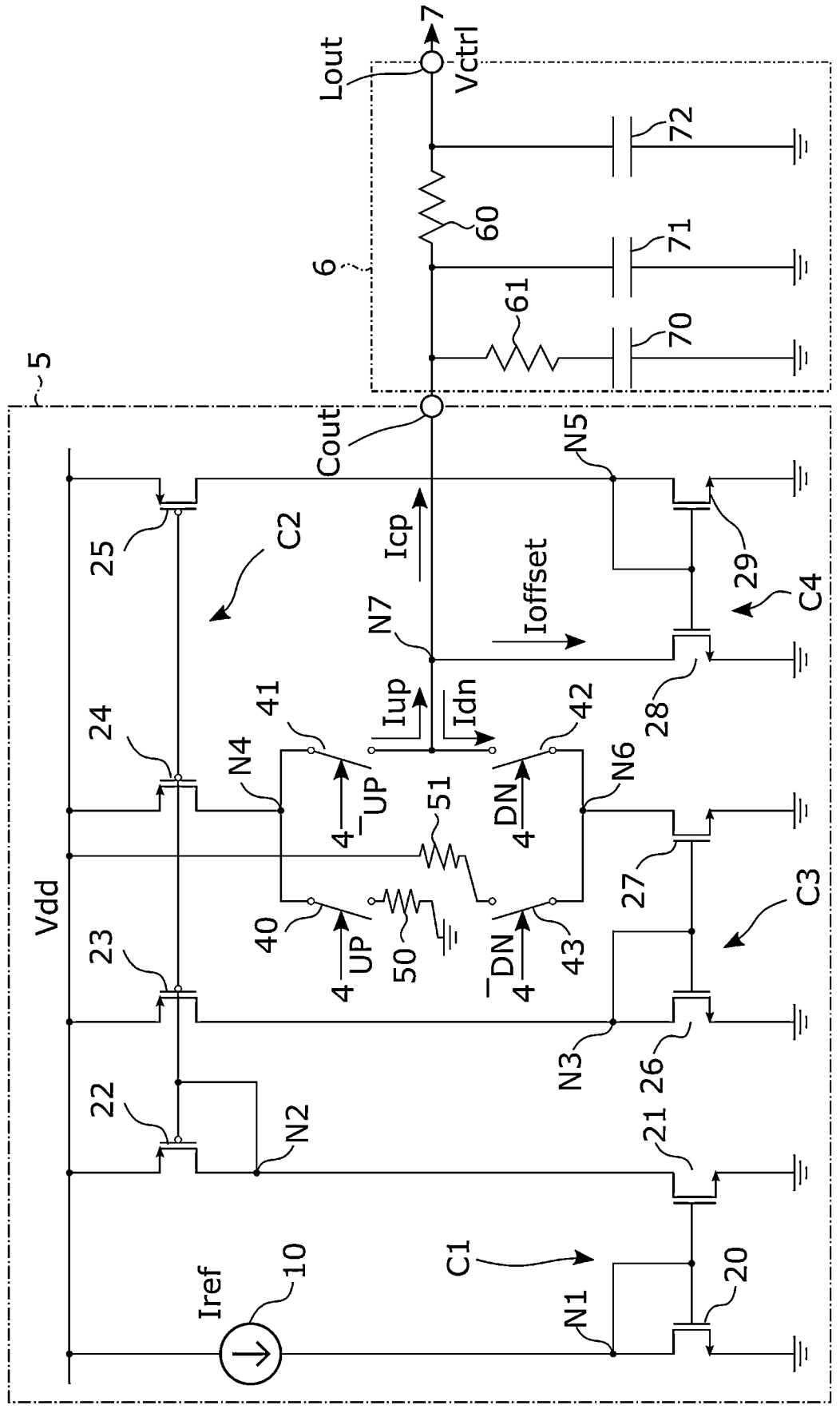
F I G. 2

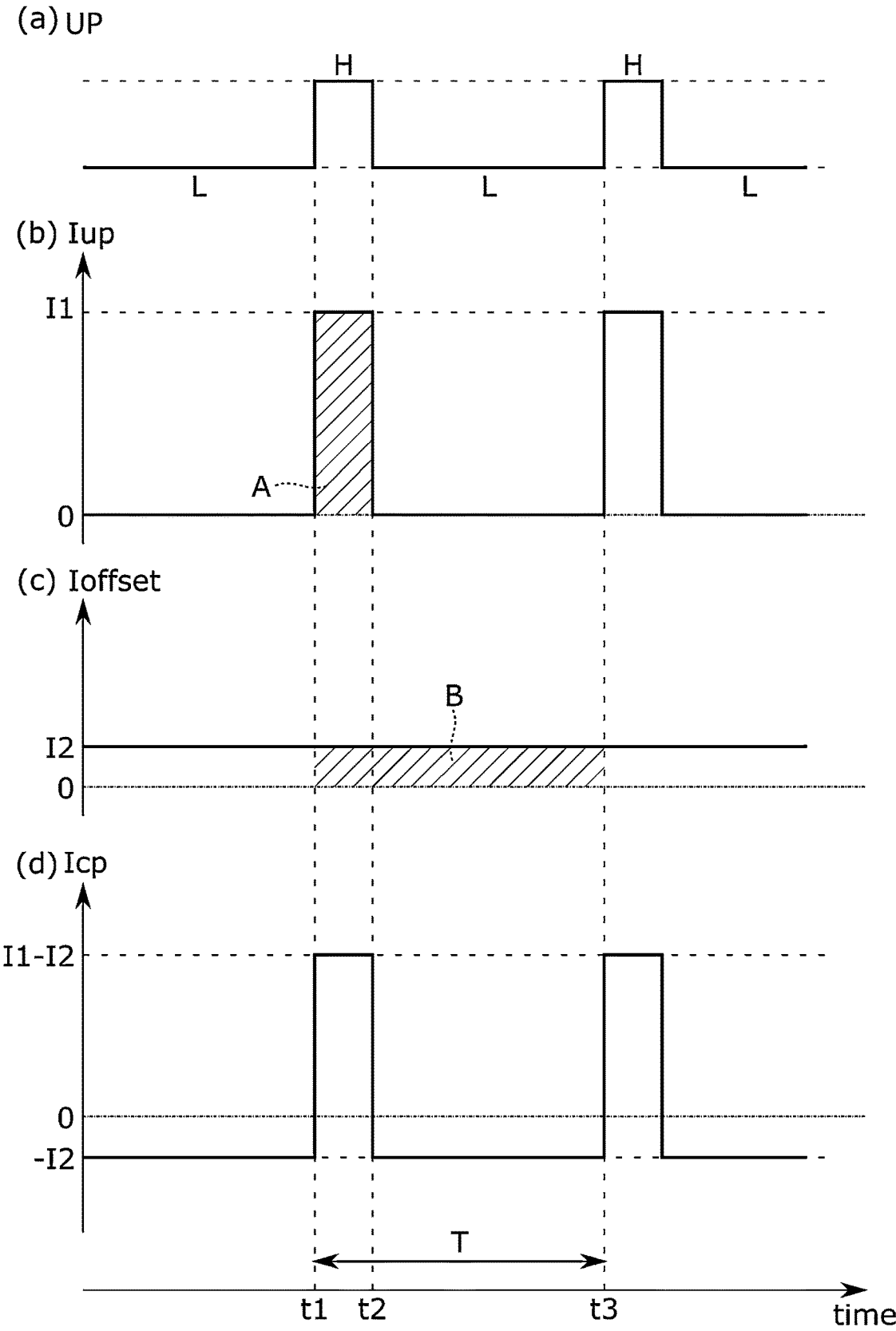
F I G. 5

CHARGE PUMP CIRCUIT AND PHASE-LOCKED LOOP CIRCUIT

CROSS-REFERENCE TO RELATED APPLICATION

This application is based upon and claims the benefit of priority from prior Japanese Patent Application No. 2023-149422, filed Sep. 14, 2023, the entire contents of which are incorporated herein by reference.

FIELD

Embodiments described herein relate generally to a charge pump circuit and a phase-locked loop circuit.

BACKGROUND

As a circuit for generating a signal that is synchronized with a frequency that serves as a reference, a phase-locked loop (PLL) circuit is known. The PLL circuit includes a charge pump (CP) circuit. In the PLL circuit, the charge pump circuit converts, for example, an error signal (voltage), which a phase detector detects, into a current signal.

BRIEF DESCRIPTION OF THE DRAWINGS

FIG. 2 is a circuit diagram illustrating configurations of a charge pump circuit and a loop filter according to the embodiment.

FIG. 5 is a timing chart illustrating an example of states of signals in a current sourcing period and a current sinking period, and magnitudes of various currents, in the charge pump circuit according to the embodiment.

DETAILED DESCRIPTION

In general, according to one embodiment, a charge pump circuit includes: a current source; a first current mirror including an input terminal connected to the current source; a second current mirror including an input terminal connected to an output terminal of the first current mirror; a third current mirror including an input terminal connected to a first output terminal of the second current mirror; a first switch including a first end connected to a second output terminal of the second current mirror via a first node, and including a second end; and an output terminal connected to an output terminal of the third current mirror and the second end of the first switch via a second node.

Hereinafter, an embodiment is described with reference to the accompanying drawings. In the description below, structural elements having substantially identical functions and structures are denoted by an identical reference sign. In a case where elements represented by reference signs including an identical character do not need to be distinguished from each other, each of these elements is referred to by a reference sign including only the character.

In the description below, an expression that a certain first element is "connected" to another second element includes a mode in which the first element is indirectly connected to the second element via an intermediate element that is always or selectively rendered conductive, or is directly connected to the second element without the intermediate element.

In the description below, a state in which both ends of a switch are electrically connected via the switch is referred to as an ON state, and a state in which both ends of the switch are not electrically connected via the switch is referred to as an OFF state.

1. Configuration

1.1. Phase-Locked Loop Circuit

Figure 1:
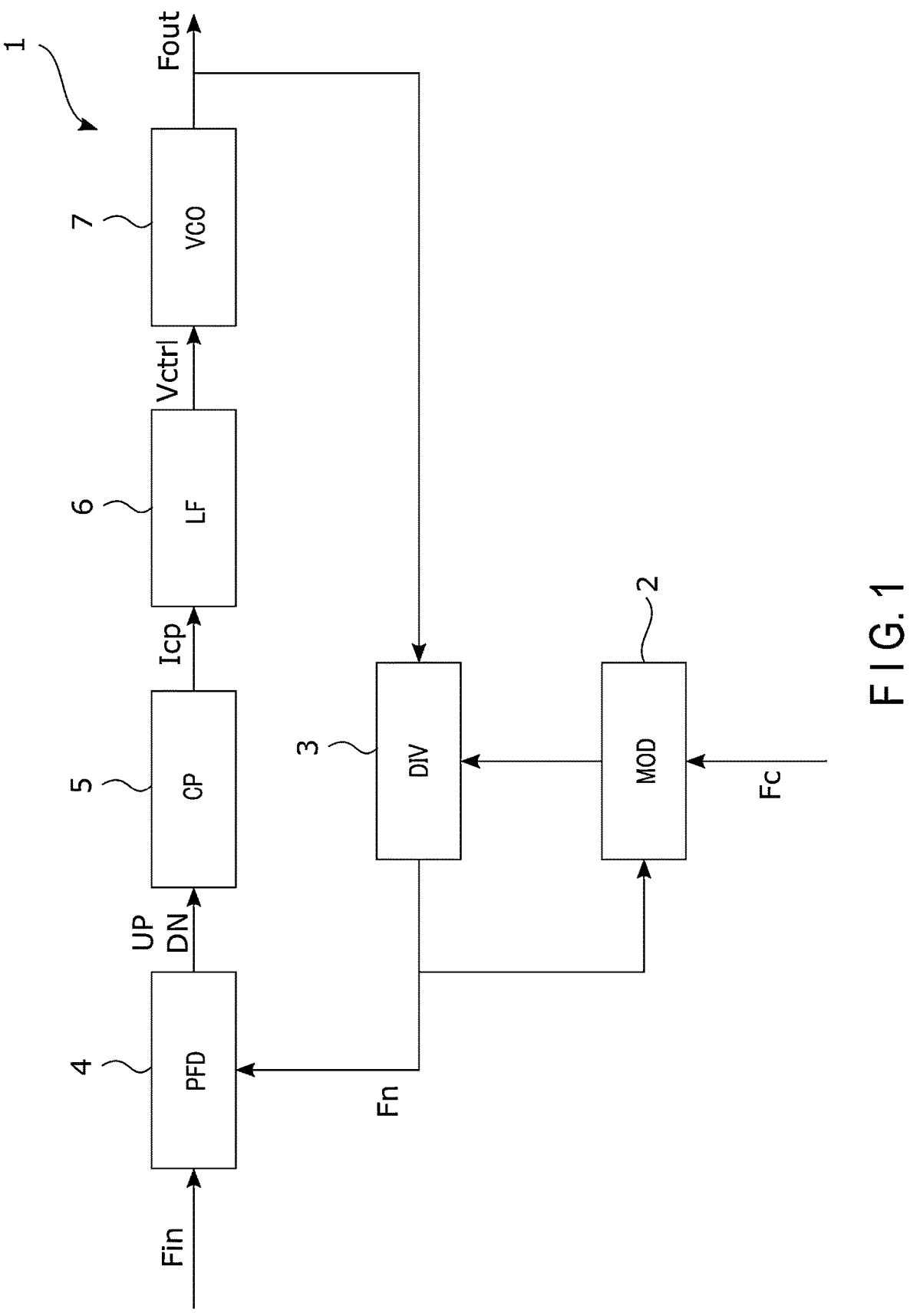
FIG. 1 is a block diagram illustrating a configuration of a PLL circuit according to an embodiment.

FIG. 1 is a block diagram illustrating a configuration of a phase-locked loop (PLL) circuit according to an embodiment.

As illustrated in FIG. 1, a PLL circuit 1 includes a modulator (MOD) 2, a divider (DIV) 3, a phase frequency detector (PFD) 4, a charge pump (CP) circuit 5, a loop filter (LF) 6, and a voltage-controlled oscillator (VCO) 7. The PLL circuit (hereinafter, may be referred to as the PLL) 1 outputs an output signal Fout, in response to an input signal Fin and a division ratio Fc. The input signal Fin is, for example, a signal having a certain frequency.

The modulator 2 is, for example, a delta-sigma modulator. The modulator 2 executes delta-sigma modulation, based on a division signal Fn that is input from the divider 3, and the division ratio Fc that is an input signal from the outside (not illustrated), and outputs a division control signal to the divider 3. The modulator 2 is configured as a semiconductor circuit device.

The divider 3 generates, based on the division control signal that is input from the modulator 2, the division signal Fn that is obtained by dividing the frequency of the output signal Fout that is fed back from the voltage-controlled oscillator 7. The divider 3 outputs the division signal Fn to the modulator 2 and the phase frequency detector 4. The division signal Fn is, for example, a signal having the same frequency as the input signal Fin. The divider 3 is configured as a semiconductor circuit device.

The phase frequency detector 4 outputs a step-up signal UP and a step-down signal DN to the charge pump 5, based on the input signal Fin from the outside (not illustrated) and the division signal Fn that is input from the divider 3. Each of the step-up signal UP and step-down signal DN is, for example, a pulse signal having a pulse width determined in accordance with a phase difference between the input signal Fin and the division signal Fn. Specifically, for example, the phase frequency detector 4 sets the step-up signal UP or step-down signal DN at "H" (high) level during a period from after one of the pulses of the input signal Fin and division signal Fn that are input falls until the other pulse falls. The phase frequency detector 4 is configured as a semiconductor circuit device.

The charge pump circuit (hereinafter, may be referred to as the charge pump) 5 supplies current Icp to the loop filter 6 during a period corresponding to the pulse width of the step-up signal UP and step-down signal DN from the phase frequency detector 4. In the description below, a direction in which the current Icp flows from the charge pump 5 to the loop filter 6 is defined as a positive direction, and the current Icp flowing in the positive direction is expressed as +Icp. A direction in which the current Icp flows from the loop filter 6 to the charge pump 5 is defined as a negative direction, and the current Icp flowing in the negative direction is expressed as −Icp. The charge pump 5 is configured as a semiconductor circuit device.

The loop filter 6 charges or discharges electric charge in accordance with the direction of the current Icp received from the charge pump 5, and converts current to DC voltage. The loop filter 6 outputs the converted voltage Vctrl to the voltage-controlled oscillator 7. The loop filter 6 is configured as a semiconductor circuit device.

The voltage-controlled oscillator 7 outputs the output signal Fout having a frequency corresponding to the magnitude of the voltage Vctrl received from the loop filter 6. The output signal Fout is, for example, a signal having a different frequency from the input signal Fin. The output signal Fout is also output to the divider 3. The voltage-controlled oscillator 7 is configured as a semiconductor circuit device.

1.2. Configuration of the Charge Pump Circuit

Next, a configuration of the charge pump 5 of the PLL 1 according to the embodiment is described with reference to FIG. 2. FIG. 2 is a circuit diagram illustrating an example of configurations of the charge pump and the loop filter according to the embodiment.

The charge pump 5 includes a current source 10, transistors 20, 21, 22, 23, 24, 25, 26, 27, 28 and 29, switches 40, 41, 42 and 43, resistors 50 and 51, and a charge pump output terminal Cout. Based on an input from the phase frequency detector 4, the charge pump 5 controls switching of the ON state and OFF state of each of the switches 40, 41, 42 and 43. In accordance with the switching, the current Icp is output from the charge pump output terminal Cout to the loop filter 6.

The transistors 20, 21, 22, 23, 24, 25, 26, 27, 28 and 29 include, for example, MOSFETS (Metal Oxide Semiconductor Field Effect Transistors). The transistors 20, 21, 26, 27, 28 and 29 include, for example, N-type MOSFETs. The transistors 22, 23, 24 and 25 include, for example, P-type MOSFETS.

The current source 10 includes an input terminal to which voltage Vdd is supplied, and an output terminal that is connected to a node N1. The voltage Vdd is a power supply voltage that drives the charge pump 5. The current source 10 outputs reference current Iref to the node N1.

The transistor 20 includes a drain terminal and a gate terminal that are connected to a node N1, and a source terminal to which voltage Vss is supplied. The voltage Vss is a ground voltage that is a reference potential at a time when the charge pump 5 operates, and is, for example, 0 V. The expression "being supplied with the voltage Vss" is also referred to as "being grounded".

The transistor 21 includes a drain terminal connected to a note N2, a source terminal supplied with the voltage Vss, and a gate terminal connected to the node N1. The transistor 21 has, for example, the same gate length and gate width as the transistor 20.

The transistors 20 and 21 are components of a current mirror C1. The current mirror C1 is composed of, for example, N-type MOSFETs.

The transistor 22 includes a drain terminal and a gate terminal that are connected to the node N2, and a source terminal supplied with the voltage Vdd. Compared to the transistor 20, the transistor 22 has, for example, about double the gate length and about double the gate width.

The transistor 23 includes a drain terminal connected to a node N3, a source terminal supplied with the voltage Vdd, and a gate terminal connected to the node N2. Compared to the transistor 20, the transistor 23 has, for example, about double the gate length and about four times the gate width.

The transistor 24 includes a drain terminal connected to a node N4, a source terminal supplied with the voltage Vdd, and a gate terminal connected to the node N2. Compared to the transistor 20, the transistor 24 has, for example, about double the gate length and about 40 times the gate width.

The transistor 25 includes a drain terminal connected to a node N5, a source terminal supplied with the voltage Vdd, and a gate terminal connected to the node N2. Compared to the transistor 20, the transistor 25 has, for example, about double the gate length and about eight times the gate width.

The transistors 22, 23, 24 and 25 are components of a current mirror C2. The current mirror C2 is composed of, for example, P-type MOSFETs.

The transistor 26 includes a drain terminal and a gate terminal that are connected to the node N3, and a source terminal supplied with the voltage Vss. Compared to the transistor 20, the transistor 26 has, for example, the same gate length and about ¼ times the gate width.

The transistor 27 includes a drain terminal connected to a node N6, a source terminal supplied with the voltage Vss, and a gate terminal connected to the node N3. Compared to the transistor 20, the transistor 27 has, for example, the same gate length and about 2.5 times the gate width.

The transistors 26 and 27 are components of a current mirror C3. The current mirror C3 is composed of, for example, N-type MOSFETs.

The transistor 28 includes a drain terminal connected to a node N7, a source terminal supplied with the voltage Vss, and a gate terminal connected to the node N5. Compared to the transistor 20, the transistor 28 has, for example, about four times the gate length and about eight times the gate width.

The transistor 29 includes a drain terminal and a gate terminal that are connected to the node N5, and a source terminal supplied with the voltage Vss. Compared to the transistor 20, the transistor 29 has, for example, about four times the gate length and about 32 times the gate width.

The transistors 28 and 29 are components of a current mirror C4. The current mirror C4 is composed of, for example, N-type MOSFETs.

The current mirrors C1 and C2, C2 and C3, and C2 and C4, are mutually connected, respectively. Specifically, the current mirror C3 causes a current which mirrors the reference current Iref to flow through the transistor 27, via the current mirrors C1 and C2. The current mirror C4 causes a current which mirrors the reference current Iref to flow through the transistor 28, via the current mirrors C1 and C2.

The switches 40, 41, 42 and 43 include, for example, transistors. The switches 40, 41, 42 and 43 execute control to connect (ON state) or disconnect (OFF state) both ends, based on at least one of the step-up signal UP, step-up signal ⁻UP, step-down signal DN, and step-down signal ⁻DN, which are input from the phase frequency detector 4. The step-up signal ⁻UP is an inverted signal of the step-up signal UP. The step-down signal ⁻DN is an inverted signal of the step-down signal DN. In the description below, each signal being at "H" level means that a voltage higher than a threshold voltage of a transistor is applied to the gate of the transistor. Each signal being at "L" (Low) level means that a voltage lower than a threshold voltage of a transistor is applied to the gate of the transistor.

The switch 40 includes, for example, a P-type MOSFET. A first terminal of the switch 40 is connected to the node N4, and a second terminal thereof is connected to the resistor 50. The switch 40 enters an OFF state, for example, in a case where the step-up signal UP is at "H" level, and enters an ON state in a case where the step-up signal UP is at "L" level.

The switch 41 includes, for example, a P-type MOSFET. A first terminal of the switch 41 is connected to the node N4, and a second terminal thereof is connected to the node N7. The switch 41 enters an OFF state, for example, in a case where the step-up signal ⁻UP is at "H" level, and enters an ON state in a case where the step-up signal ⁻UP is at "L" level.

Since the step-up signals UP and UP, which the switches 40 and 41 receive, respectively, have a relationship of mutually inverted signals, the switches 40 and 41 can be regarded as one SPDT (Single Pole Double Throw) switch. Specifically, in the case where the step-up signal UP is at "H" level (and the step-up signal ⁻UP is at "L" level), the transistor 24 and the charge pump output terminal Cout are electrically connected. In the case where the step-up signal UP is at "L" level (and the step-up signal ⁻UP is at "H" level), the transistor 24 and the resistor 50 are electrically connected.

The switch 42 includes, for example, an N-type MOSFET. A first terminal of the switch 42 is connected to the node N6, and a second terminal thereof is connected to the node N7. The switch 42 enters an ON state, for example, in a case where the step-down signal DN is at "H" level, and enters an OFF state in a case where the step-down signal DN is at "L" level.

The switch 43 includes, for example, an N-type MOSFET. A first terminal of the switch 43 is connected to the node N6, and a second terminal thereof is connected to the resistor 51. The switch 43 enters an ON state, for example, in a case where the step-down signal ⁻DN is at "H" level, and enters an OFF state in a case where the step-down signal ⁻DN is at "L" level.

Since the step-down signals DN and ⁻DN, which the switches 42 and 43 receive, respectively, have a relationship of mutually inverted signals, the switches 42 and 43 can be regarded as one SPDT switch. Specifically, in the case where the step-down signal DN is at "H" level (and the step-down signal ⁻DN is at "L" level), the transistor 27 and the charge pump output terminal Cout are electrically connected. In the case where the step-down signal DN is at "L" level (and the step-down signal ⁻DN is at "H" level), the transistor 27 and the resistor 51 are electrically connected.

The resistor 50 is a pull-down resistor. One end of the resistor 50 is connected to the second terminal of the switch 40, and the other end thereof is grounded.

The resistor 51 is a pull-up resistor. One end of the resistor 51 is connected to the second terminal of the switch 43, and the other terminal thereof is supplied with the voltage Vdd.

The charge pump output terminal Cout is connected to the node N7. The charge pump output terminal Cout outputs the current Icp to the loop filter 6.

The loop filter 6 includes resistors 60 and 61, capacitors 70, 71 and 72, and a loop filter output terminal Lout.

The resistor 60 has one end connected to the charge pump output terminal Cout, and has the other end connected to the loop filter output terminal Lout.

The resistor 61 has one end connected to the charge pump output terminal Cout and to the one end of the resistor 60, and has the other end connected to the capacitor 70.

The capacitor 70 has one end connected to the other end of the resistor 61, and has the other end grounded.

The capacitor 71 has one end connected to the charge pump output terminal Cout, the one end of the resistor 60, and the one end of the resistor 61, and has the other end grounded.

The capacitor 72 has one end connected to the loop filter output terminal Lout and to the other end of the resistor 60, and has the other end grounded.

The capacitors 70, 71 and 72 charge electric charge if the current Icp is sourced from the charge pump 5, and discharge electric charge if the current Icp is sunk by the charge pump 5.

The loop filter output terminal Lout is connected to the other end of the resistor 60 and the one end of the capacitor 72, and outputs the voltage Vctrl to the voltage-controlled oscillator 7.

2. Operation of the Phase-Locked Loop Circuit

Next, an operation of the PLL according to the embodiment is described.

2.1. Setup Operation

Figure 3:
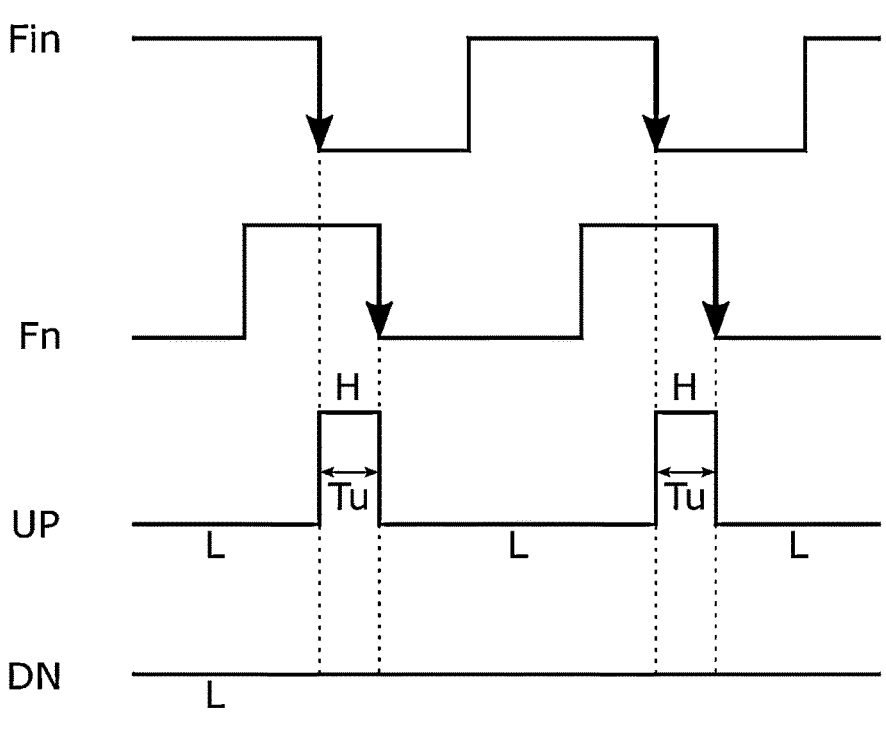
FIG. 3 is a waveform diagram illustrating a first example of waveforms of various signals in a setup operation in the PLL circuit according to the embodiment.
Figure 4:
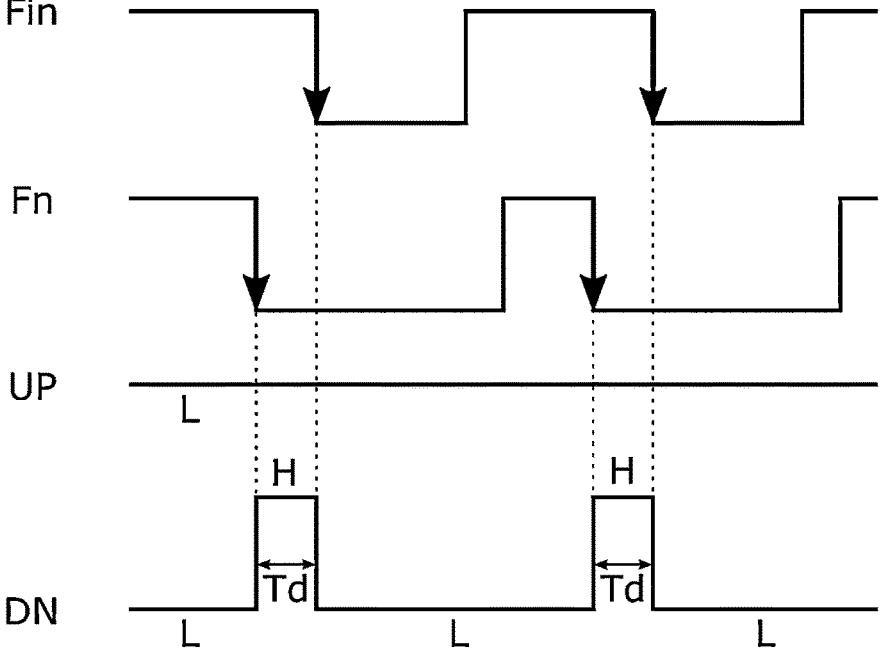
FIG. 4 is a waveform diagram illustrating a second example of the waveforms of the various signals in the setup operation in the PLL according to the embodiment.

In the charge pump 5, a setup operation up to locking of phases is first executed. In the setup operation, the charge pump 5 operates in such a manner as to reduce a phase difference between the input signal Fin that serves as the reference, and the division signal Fn. FIG. 3 is a waveform diagram illustrating a first example of waveforms of various signals in a setup operation in the PLL according to the embodiment. FIG. 4 is a waveform diagram illustrating a second example of the waveforms of the various signals in the setup operation in the PLL according to the embodiment. FIG. 3 and FIG. 4 illustrate, as the various signals, the input signal Fin, division signal Fn, step-up signal UP, and step-down signal DN. The first example illustrates a case where the phase of the division signal Fn lags behind the phase of the input signal Fin. The second example illustrates a case where the phase of the division signal Fn is ahead the phase of the input signal Fin.

In the setup operation, the phase frequency detector 4 compares the phases of the input signal Fin and the division signal Fn, and outputs the step-up signal UP or step-down signal DN to the charge pump 5. In the description below, both the step-up signal UP and the step-down signal DN are at "L" level in a period that is not particularly mentioned.

For example, as illustrated in FIG. 3, in the case where the phase of the division signal Fn lags behind, relative to the input signal Fin, the phase frequency detector 4 sets the step-up signal UP at "H" level during a period corresponding to a phase difference. Specifically, the step-up signal UP is set at "H" level during a period Tu from the fall of the input signal Fin to the fall of the division signal Fn. During this period Tu, the step-down signal DN remains at "L" level.

Upon receiving the step-up signal UP of "H" level and the step-down signal DN of "L" level, the charge pump 5 sets the switches 41 and 43 in the ON state, and sets the switches 40 and 42 in the OFF state. At this time, current Iup flows and current Idn does not flow. In addition, current Ioffset flows. Since the magnitude of the current Iup is sufficiently greater than that of the current Ioffset, the current Icp takes a positive value. Specifically, the charge pump 5 sources the current Icp.

Since the charge pump 5 sources the current Icp, charge is accumulated in the capacitors 70, 71 and 72 in the loop filter 6. In other words, the capacitors 70, 71 and 72 enter the accumulated state. As a result, the voltage Vctrl that is applied to the loop filter output terminal Lout rises (or increases). In accordance with the length of the period during which the voltage Vctrl rises (or increases), the frequency of the output signal Fout increases, and accordingly the frequency of the division signal Fn also increases.

For example, as illustrated in FIG. 4, in the case where the phase of the division signal Fn is ahead, relative to the input signal Fin, the phase frequency detector 4 sets the step-down signal DN at "H" level during a period corresponding to a phase difference. Specifically, the step-down signal DN is set at "H" level during a period Td from the fall of the division signal Fn to the fall of the input signal Fin. During this period Td, the step-up signal UP remains at "L" level.

Upon receiving the step-up signal UP of "L" level and the step-down signal DN of "H" level, the charge pump 5 sets the switches 40 and 42 in the ON state, and sets the switches 41 and 43 in the OFF state. At this time, the current Iup does not flow and the current Idn flows. In addition, the current Ioffset flows. Accordingly, the current Icp takes a negative value. Specifically, the charge pump 5 sinks the current.

Since the charge pump 5 sinks the current Icp, the charge accumulated in the capacitors 70, 71 and 72 is discharged in the loop filter 6. In other words, the capacitors 70, 71 and 72 enter the discharged state. As a result, the voltage Vctrl that is applied to the loop filter output terminal Lout lowers (or decreases). In accordance with the length of the period during which the voltage Vctrl lowers (or decreases), the frequency of the output signal Fout decreases, and accordingly the frequency of the division signal Fn also decreases.

At a time when the phases of the input signal Fin and the division signal Fn have become coincident with each other after the setup operation, the PLL 1 enters a steady state. In the steady state, the PLL 1 is "locked". When the PLL 1 is locked, for example, the PLL 1 can steadily output the desired output signal Fout.

2.2. Sourcing Operation and Sinking Operation

When the PLL 1 is locked, in the charge pump 5, sourcing and sinking of the current Icp is executed in every cycle of the input signal Fin, and thereby the output signal Fout having a substantially fixed frequency is output. Hereinafter, this operation is described in detail with reference to FIGS. 5, 6 and 7.

Figure 6:
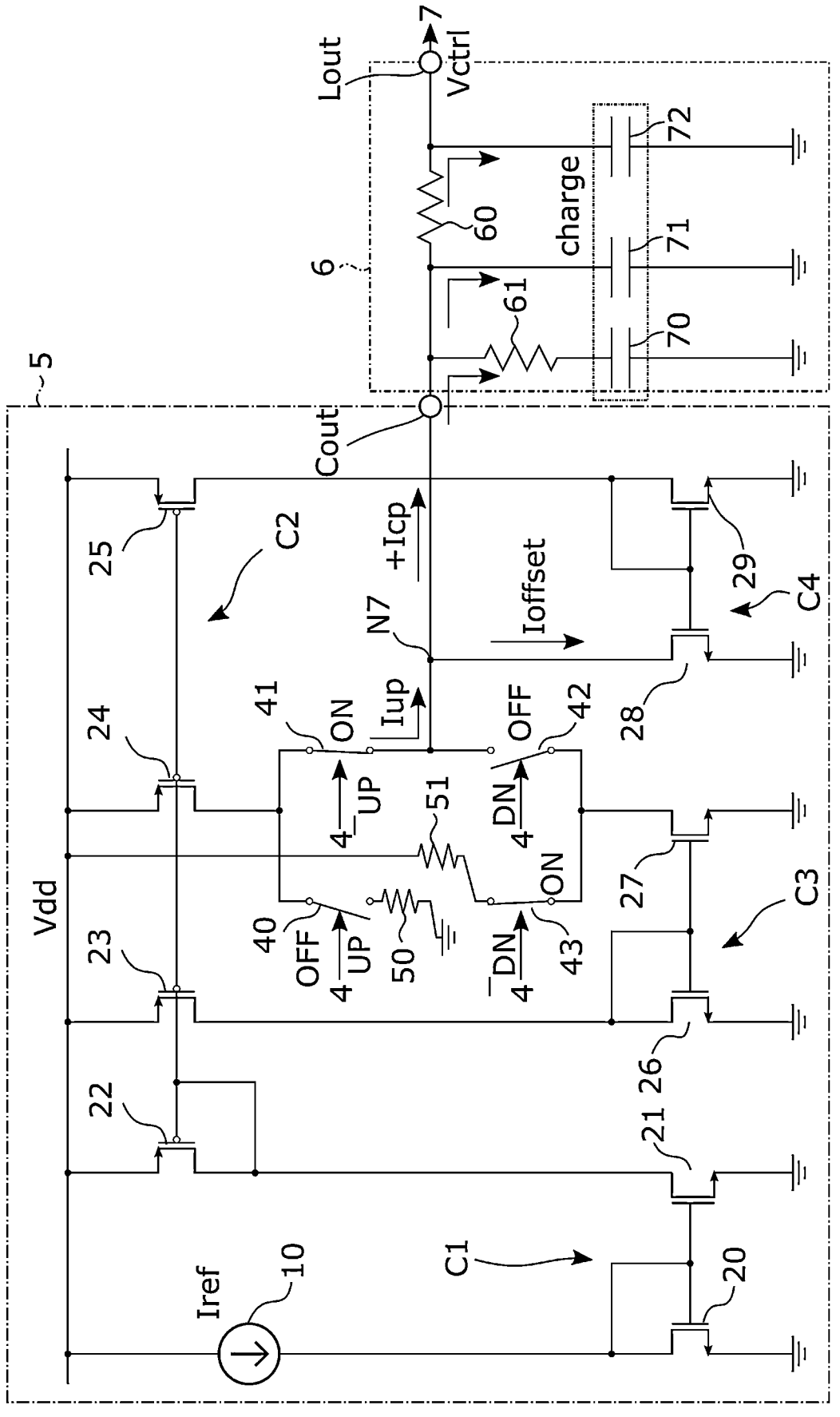
FIG. 6 is a circuit diagram illustrating an example of a current path in the current sourcing period of the charge pump circuit and the loop filter according to the embodiment.
Figure 7:
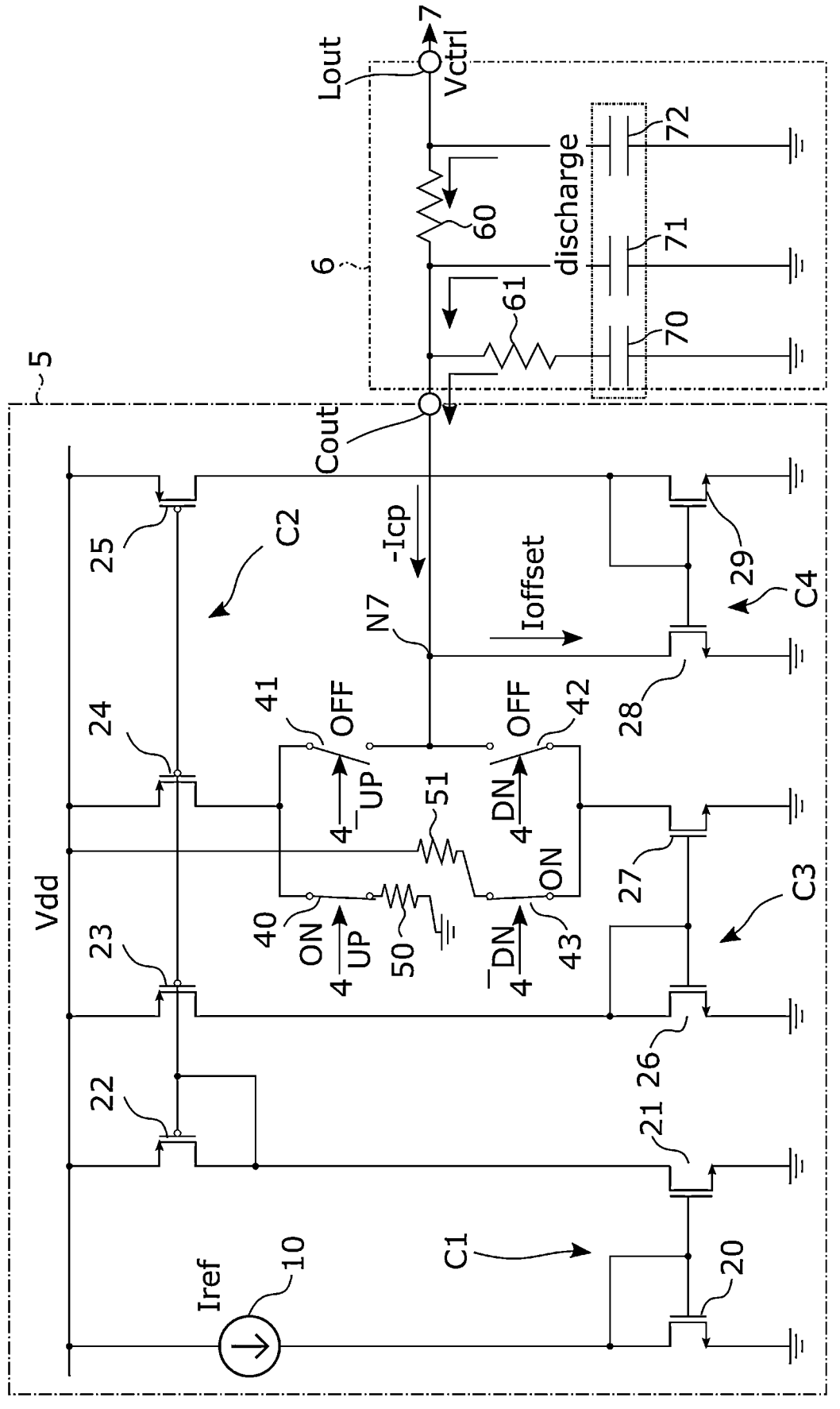
FIG. 7 is a circuit diagram illustrating an example of a current path in the current sinking period of the charge pump circuit and the loop filter according to the embodiment.

FIG. 5 is a timing chart illustrating an example of states of signals and magnitudes of various currents in the charge pump 5 according to the embodiment. Part (a) of FIG. 5 illustrates a state of the step-up signal UP. Part (b) of FIG. 5 illustrates a variation of the current Iup flowing through the switch 41. Part (c) of FIG. 5 illustrates a variation of the current Ioffset flowing in the transistor 28. Part (d) of FIG. 5 illustrates a variation of the current Icp flowing through the charge pump output terminal Cout. FIG. 6 is a circuit diagram illustrating an example of a current path in the current sourcing period of the charge pump according to the embodiment. FIG. 7 is a circuit diagram illustrating an example of a current path in the current sinking period of the charge pump according to the embodiment. The current sourcing period corresponds to a period from time t1 to time t2 in FIG. 5. The current sinking period corresponds to a period from time t2 to time t3 in FIG. 5. A period from time t1 to time t3 corresponds to a cycle T of the input signal Fin.

To begin with, referring to FIG. 5 and FIG. 6, a description is given of operations of the charge pump 5 and loop filter 6 in the current sourcing period. In the current sourcing period, the step-up signal UP of "H" level and the step-down signal DN of "L" are input. Thereby, the switches 41 and 43 enter the ON state, and the switches 40 and 42 enter the OFF state. At this time, the current Iup flows at I1 (>0). In addition, the current Ioffset continues to flow at I2 (>0). Accordingly, the magnitude of the current Icp is I1–I2. Since the magnitude of the current I1 is sufficiently greater (for example, ten times greater) than the magnitude of the current I2, the current Icp takes a positive value (I1–I2>0). Specifically, during this period, the charge pump 5 sources current.

By the charge pump 5 sourcing the current Icp, charge is accumulated in the capacitors 70, 71 and 72 in the loop filter 6. Specifically, the capacitors 70, 71 and 72 enter the accumulated state. As a result, the voltage Vctrl that is applied to the loop filter output terminal Lout rises (or increases).

Next, referring to FIG. 5 and FIG. 7, a description is given of operations of the charge pump 5 and loop filter 6 in the current sinking period. In the current sinking period, the step-up signal UP of "L" level and the step-down signal DN of "L" are input. Thereby, the switches 40 and 43 enter the ON state, and the switches 41 and 42 enter the OFF state. At this time, the current Iup does not flow. On the other hand, since the current Ioffset continues to flow at I2, the magnitude of the current Icp becomes a negative value of –I2. Specifically, during this period, the charge pump 5 sinks the current Icp.

By the charge pump 5 sinking the current Icp, the charge accumulated in the capacitors 70, 71 and 72 in the loop filter 6 is discharged. Specifically, the capacitors 70, 71 and 72 enter the discharged state. As a result, the voltage Vctrl that is applied to the loop filter output terminal Lout lowers (or decreases).

During the cycle T, the amount of charge flowing as the current Iup is equal to the amount of charge flowing as the current Ioffset. In other words, the area of a region A indicated by hatching in part (b) of FIG. 5 is equal to the area of a region B indicated by hatching in part (c) of FIG. 5. Thus, the total amount of charge accumulated in the capacitors 70, 71 and 72 at cycle start time t1 becomes equal to the total amount of charge accumulated in the capacitors 70, 71 and 72 at cycle end time t3.

By the above-described cycle, the voltage Vctrl generated by the loop filter 6 varies and is output to the voltage-controlled oscillator 7, and the voltage-controlled oscillator 7 outputs the output signal Fout. In this manner, the PLL 1 maintains the steady state.

3. Advantageous Effects According to the Embodiment

With the configuration according to the present embodiment, there can be provided a charge pump in which noise is small, an increase in installation area can be suppressed, and an increase in the number of design steps can be suppressed. The advantageous effects of the embodiment are described in detail.

In the charge pump according to the present embodiment, the current mirrors C3 and C4 are connected to the current mirror C1 via the current mirror C2. Specifically, the sizes of the current mirrors C1, C3 and C4 are independently configured. By this configuration, in a case where transistors being components of a current mirror are increased in size in order to reduce noise, the number of transistors that have to be increased in size incidentally can be reduced. Thus, transistors that do not contribute to superimposition of noise can be reduced in size (may not be increased in size).

Accordingly, the size of the entire circuitry of the charge pump according to the present embodiment can be reduced, compared with a charge pump having a configuration such that current mirrors are shared.

In a case where the charge pump outputs the current Icp, it is known that noise, such as flicker noise and thermal noise, due to the transistors and the current source is mixed in. The noise is undesirable since there is a possibility that the noise deteriorates the quality of a signal to be transmitted, and may lead to an output of an unintended signal. In addition, in the current mirror in the charge pump, noise occurring in a mirror-source transistor may be superimposed on current flowing in a mirror-destination transistor in accordance with a mirror ratio. Consequently, there is a case where, during passage through the current mirror, noise due to a plurality of transistors is superimposed, resulting in occurrence of greater noise.

As a method of reducing noise in the charge pump, there is known a method in which transistors are increased in size, and the current flowing through the transistors is increased, thereby suppressing flicker noise that becomes greater in inverse proportion to current. However, with the increase in size of transistors, the installation area of the charge pump also increases. In addition, in order to match the current flowing in circuitry with a particular value, it is necessary to adjust the gate length and gate width in the current mirror. Accordingly, when the size of one of the transistors being components of the current mirror is increased in order to reduce noise, the sizes of the other transistors being components of the same current mirror are also increased. From the above, there is a problem whereby the reduction in size of the charge pump is difficult.

With the configuration according to the present embodiment, noise can be reduced by canceling the noise superimposed in the charge cycle and discharge cycle in the signal output in the state in which the PLL 1 is locked.

In the charge cycle, the current +Icp flowing in the positive direction through the charge pump output terminal Cout is output by mirroring the reference current Iref. The current +Icp reflects the characteristics of the circuitry connected via the transistors 20, 21, 22 and 24 from the current source 10 that outputs the reference current Iref. Accordingly, the noise due to the current source 10 and the transistors 20, 21, 22 and 24 is superimposed on the current +Icp.

On the other hand, in the discharge cycle, the current −Icp flowing in the negative direction through the charge pump output terminal Cout is also output by mirroring the reference current Iref. The current −Icp reflects the characteristics of the circuitry connected via the transistors 20, 21, 22, 25, 28 and 29 from the current source 10 that outputs the reference current Iref. Accordingly, the noise due to the current source 10 and the transistors 20, 21, 22, 25, 28 and 29 is superimposed on the current −Icp.

Since the current +Icp and the current −Icp are signals of opposite directions, the noise superimposed on both of them is canceled. Specifically, in the state in which the PLL 1 is locked, the noise due to the current source 10 and transistors 20, 21 and 22 can be ignored. In addition, in the state in which the PLL 1 is locked, it is very rare that the switch 42 is set in the ON state. Thus, the noise due to the transistors 23, 26 and 27 can be ignored.

From the above, the source of occurrence of the noise superimposed on the signal that is output from the loop filter 6 is limited to the transistors 24, 25, 28 and 29. The noise can be reduced by making the sizes of only the transistors 24, 25, 28 and 29 greater than the sizes of the other transistors.

In addition, in the configuration according to the present embodiment, the transistors 20, 21, 22, 23, 26 and 27 can be reduced in size since the noise due to these transistors is not superimposed on the signal that is output from the loop filter 6. Specifically, the gate length of each of the transistors 20, 21, 22, 23, 26 and 27 can be reduced to about ½ or less of the gate length of the transistor 28. The gate width of each of the transistors 20, 21, 22, 23, 26 and 27 can be reduced to about ½ or less of the gate width of the transistor 28. From the above, an increase in installation area of the entire circuitry of the charge pump can be suppressed, and the charge pump can be reduced in size.

Moreover, with the configuration according to the present embodiment, in the current sinking operation, the charge pump can be constituted without using an amplifier, an extra switch and the like. Thereby, complex control of the amplifier or the extra switch is unnecessary, and the number of simulation steps and the length of simulation terms can be reduced. Thus, an increase in the number of design steps can be suppressed, while the charge pump can be reduced in size. Therefore, the charge pump and the PLL can be efficiently manufactured.

4. Others

In a modification of the present embodiment, a configuration is conceivable in which the transistors 20, 21, 26, 27, 28 and 29 include P-type MOSFETs, and the transistors 22, 23, 24 and 25 include N-type MOSFETs. At this time, in the present modification, the voltage Vss is applied to the terminals to which the voltage Vdd is applied in the present embodiment. In the present modification, the voltage Vdd is applied to the terminals to which the voltage Vss is applied in the present embodiment. In addition, the direction of flow of the reference current Iref of the current source 10 is reversed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A charge pump circuit comprising:
   a current source;
   a first current mirror including an input terminal connected to the current source;
   a second current mirror including an input terminal connected to an output terminal of the first current mirror;
   a third current mirror including an input terminal connected to a first output terminal of the second current mirror;
   a fourth current mirror including an input terminal connected to a second output terminal of the second current mirror, and including an output terminal connected to a first node;
   a first switch including a first end connected to a third output terminal of the second current mirror via a second node, and including a second end connected to the first node;

a second switch including a first end connected to an output terminal of the third current mirror via a third node, and including a second end connected to the first node; and an output terminal connected to the first node.

2. The charge pump circuit of claim 1, wherein each of the first current mirror, the third current mirror, and the fourth current mirror includes a transistor having a first conductivity type, and the second current mirror includes a transistor having a second conductivity type that is different from the first conductivity type.

3. The charge pump circuit of claim 2, wherein the transistor having the first conductivity type includes an N-type MOSFET, and the transistor having the second conductivity type includes a P-type MOSFET.

4. The charge pump circuit of claim 1, wherein the first current mirror includes:

a first transistor including a drain and a gate that are connected to the current source via a fourth node; and a second transistor including a gate connected to the fourth node, and including a drain connected to the input terminal of the second current mirror via a fifth node, the second current mirror includes:

a third transistor including a drain and a gate that are connected to the fifth node;

a fourth transistor including a drain connected to the input terminal of the fourth current mirror via a sixth node, and a gate connected to the fifth node; and a fifth transistor including a drain connected to the second node, and a gate connected to the fifth node, and the fourth current mirror includes:

a sixth transistor including a drain and a gate that are connected to the sixth node; and a seventh transistor including a drain connected to the first node, and a gate connected to the sixth node.

5. The charge pump circuit of claim 4, wherein a gate length of each of the first transistor, the second transistor and the third transistor is equal to or less than about ½ of a gate length of the seventh transistor, and a gate width of each of the first transistor, the second transistor and the third transistor is equal to or less than about ½ of a gate width of the seventh transistor.

6. The charge pump circuit of claim 4, wherein the second current mirror further includes an eighth transistor including a drain connected to the input terminal of the third current mirror via a seventh node, and including a gate connected to the fifth node, and the third current mirror includes:

a ninth transistor including a drain and a gate that are connected to the seventh node; and a tenth transistor including a drain connected to the third node, and a gate connected to the seventh node.

7. The charge pump circuit of claim 6, wherein a gate length of each of the first transistor, the second transistor, the third transistor, the eighth transistor and the ninth transistor is equal to or less than about ½ of a gate length of the seventh transistor, and a gate width of each of the first transistor, the second transistor, the third transistor, the eighth transistor and the ninth transistor is equal to or less than about ½ of a gate width of the seventh transistor.

8. The charge pump circuit of claim 1, further comprising:

a third switch including a first end connected to the second node, and including a second end; and a first resistor including one end connected to the second end of the third switch.

9. The charge pump circuit of claim 8, wherein each of the first switch and the third switch includes a transistor.

10. The charge pump circuit of claim 8, wherein the third switch is configured to be in an OFF state, in a case where the first switch is in an ON state, and the third switch is configured to be in an ON state, in a case where the first switch is in an OFF state.

11. The charge pump circuit of claim 8, further comprising:

a fourth switch including a first end connected to the third node, and including a second end; and a second resistor including one end connected to the second end of the fourth switch.

12. The charge pump circuit of claim 11, wherein each of the second switch and the fourth switch includes a transistor having a first conductivity type, and each of the first switch and the third switch includes a transistor having a second conductivity type that is different from the first conductivity type.

13. The charge pump circuit of claim 12, wherein the transistor having the first conductivity type includes an N-type MOSFET, and the transistor having the second conductivity type includes a P-type MOSFET.

14. The charge pump circuit of claim 11, wherein the third switch is configured to be in an OFF state, in a case where the first switch is in an ON state, the third switch is configured to be in an ON state, in a case where the first switch is in an OFF state, the fourth switch is configured to be in an OFF state, in a case where the second switch is in an ON state, and the fourth switch is configured to be in an ON state, in a case where the second switch is in an OFF state.

15. A phase-locked loop circuit comprising:

the charge pump circuit of claim 1;

a phase frequency detector connected to the charge pump circuit;

a loop filter connected to the charge pump circuit;

a voltage-controlled oscillator connected to the loop filter; and a divider connected to the phase frequency detector and the voltage-controlled oscillator.

16. The phase-locked loop circuit of claim 15, wherein the charge pump circuit is configured to:

output a first current to the loop filter via the output terminal in a case where the first switch is in an ON state; and input a second current from the loop filter via the output terminal in a case where the first switch is in an OFF state.

17. The phase-locked loop circuit of claim 16, wherein in a first state, a total amount of charge based on the first current that is output from the charge pump circuit to the loop filter during one cycle of a signal that is input to the phase frequency detector is substantially equal to a total amount of charge based on the second current that is input from the loop filter to the charge pump circuit during the cycle.

18. The phase-locked loop circuit of claim 15, wherein the phase frequency detector is configured to control the first switch by applying a voltage to the first switch.

19. The phase-locked loop circuit of claim 15, wherein each of the first current mirror, the third current mirror, and the fourth current mirror includes a transistor having a first conductivity type, and the second current mirror includes a transistor having a second conductivity type that is different from the first conductivity type.

20. The phase-locked loop circuit of claim 19, wherein the transistor having the first conductivity type includes an N-type MOSFET, and the transistor having the second conductivity type includes a P-type MOSFET.

\* \* \* \* \*